United States Patent
Zhuang et al.

(10) Patent No.: US 10,116,315 B1
(45) Date of Patent: Oct. 30, 2018

(54) SYSTEM-ON-A-CHIP CLOCK PHASE MANAGEMENT USING FRACTIONAL-N PLLS

(71) Applicant: QUALCOMM Incorporated, San Diego, CA (US)

(72) Inventors: Jingcheng Zhuang, San Diego, CA (US); Frederic Bossu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/711,918

(22) Filed: Sep. 21, 2017

(51) Int. Cl.
*H03D 3/24* (2006.01)
*H03L 7/197* (2006.01)
*H04L 7/033* (2006.01)
*H04L 7/00* (2006.01)
*H03B 1/02* (2006.01)
*H03L 7/23* (2006.01)
*H03L 7/099* (2006.01)
*H03L 7/093* (2006.01)

(52) U.S. Cl.
CPC .......... *H03L 7/1976* (2013.01); *H03B 1/02* (2013.01); *H03L 7/093* (2013.01); *H03L 7/0992* (2013.01); *H03L 7/0995* (2013.01); *H03L 7/23* (2013.01); *H04L 7/0008* (2013.01); *H04L 7/033* (2013.01)

(58) Field of Classification Search
CPC ....... H03L 7/1976; H03L 7/23; H03L 7/0995; H03L 7/0992; H03L 7/093; H03L 7/0994; H03L 7/1806; H04L 7/033; H04L 7/0008; H03B 1/02
USPC ................. 375/373, 374, 375, 376
See application file for complete search history.

(56) References Cited

U.S. PATENT DOCUMENTS

| | | | |
|---|---|---|---|
| 8,810,290 B1 * | 8/2014 | Cloutier | H03L 7/0994 327/147 |
| 8,873,647 B2 | 10/2014 | Liu et al. | |
| 8,952,736 B1 | 2/2015 | Evans et al. | |
| 9,306,730 B1 | 4/2016 | Shu et al. | |
| 9,484,939 B2 | 11/2016 | Luo et al. | |
| 2016/0173111 A1 * | 6/2016 | Cali | H03L 7/1806 327/156 |
| 2016/0226502 A1 | 8/2016 | Cali et al. | |

* cited by examiner

*Primary Examiner* — Phuong Phu
(74) *Attorney, Agent, or Firm* — Haynes and Boone, LLP (57) ABSTRACT

A clock distribution architecture is provided in which the output clock signals from a plurality of fractional-N PLLs have a known phase relationship because each fractional-N PLL is configured to commence a phase accumulation responsive to a corresponding edge of a reference clock signal.

17 Claims, 6 Drawing Sheets

SYSTEM-ON-A-CHIP CLOCK PHASE MANAGEMENT USING FRACTIONAL-N PLLS

TECHNICAL FIELD

This application relates to fractional-N phase-locked loops (PLLs), and more particularly to the phase alignment of multiple fractional-N PLLs.

BACKGROUND

Figure 1:
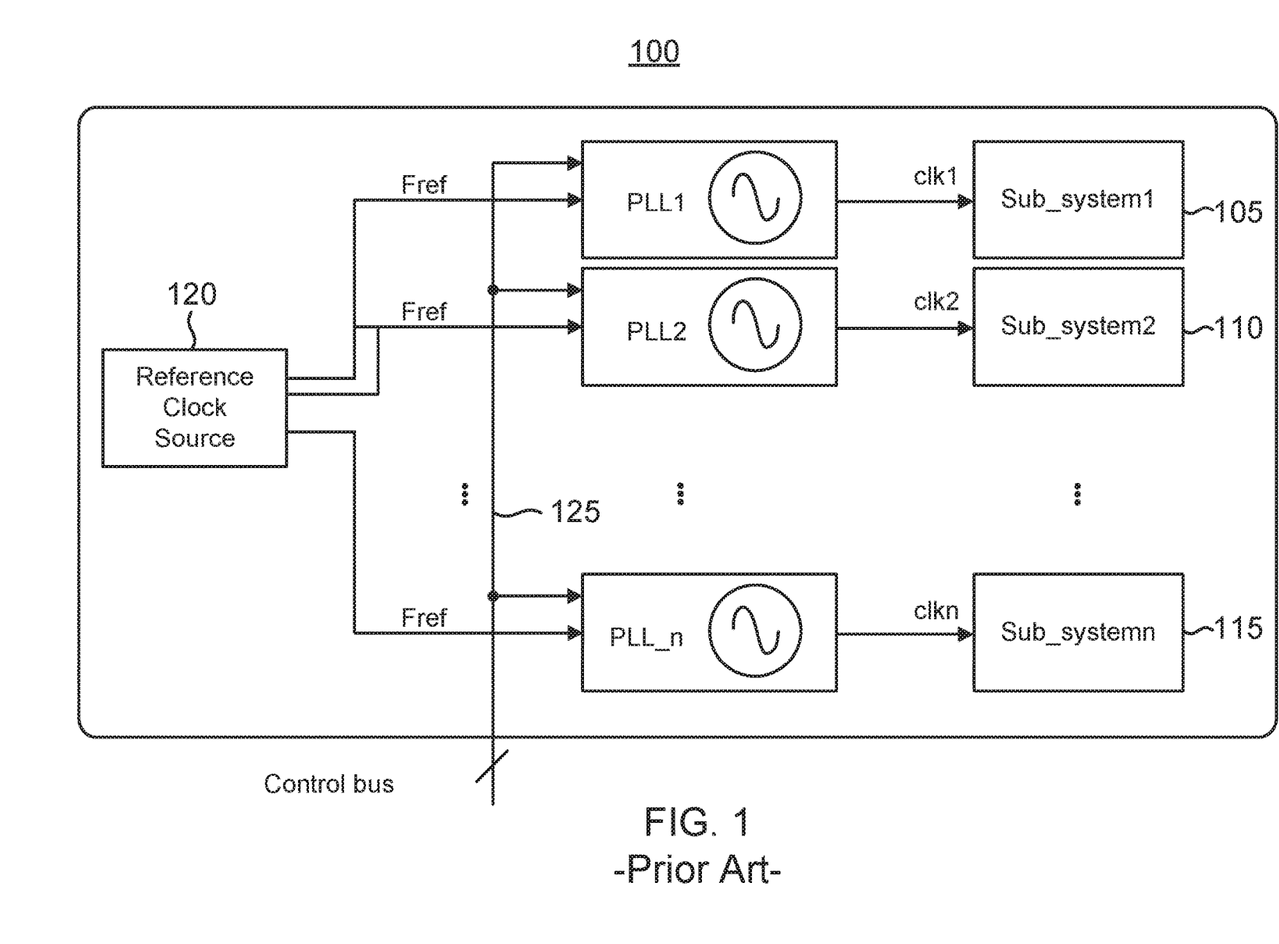
FIG. 1 illustrates a conventional clock distribution architecture for an SoC in which the sub-systems are clocked by fractional-N PLLs.

An integrated circuit such as a system-on-a-chip (SoC) often includes sub-systems such as receivers and transmitters that are clocked by corresponding clock signals. To keep the various sub-systems synchronized, it is conventional for an SoC to include a reference clock transmitter that provides a reference clock to a plurality of PLLs. Each PLL provides an output clock signal to a corresponding subsystem. An example clock distribution architecture for an SoC 100 is shown in FIG. 1. SoC 100 includes a plurality of n sub-systems ranging from a first sub-system 105, followed by a second sub-system 110, and so on to a final nth sub-system 115. Each sub-system is clocked by a corresponding clock signal. First sub-system 105 is thus clocked by a first clock signal clk1, second sub-system 110 is clocked by a second clock signal clk2 and so on such that nth sub-system 115 is clocked by an nth clock signal clkn. Each clock signal is produced by a fractional-N PLL. A first fractional-N PLL (PLL1) produces the first clock signal clk1, a second fractional-N PLL (PLL2) produces the second clock signal clk2, and so on such that an nth fractional-N PLL (PLL_n) produces the nth clock signal clkn. Each fractional-N PLL produces its clock signal responsive to a reference clock signal Fref from a reference clock source 120 such as a crystal oscillator.

The use of fractional-N PLLs in SoC 100 provides greater flexibility with regard to the frequency for the clocking of the sub-systems. In contrast, the clock frequency from an integer-N PLL has an integer relationship to the reference clock. But a fractional-N PLL untethers the sub-system clocking from such an integer relationship so that the sub-system clock frequencies can have a non-integer relationship to the reference clock. Although fractional-N PLLs thus provide advantageous frequency flexibility, their usage introduces a phase ambiguity between the various sub-system clocks. In particular, it is conventional for each fractional-N PLL to be shut down while the corresponding sub-system is in a dormant or sleep mode of operation to enable low-power operation of SoC 100. Each fractional-N PLL thus operates only when enabled such as commanded through a multi-bit enable signal 125. Due to the fractional division in the fractional-N PLLs, the clocking frequencies for the sub-systems will have a phase relationship that varies depending upon when a particular sub-system was enabled. This random phase relationship is problematic in a number of applications. For example, in the uplink and downlink during multiple-input-multiple-output (MIMO) operation, a known phase relationship avoids unnecessary channel estimations. Moreover, undesirable couplings between the sub-systems may be minimized through an optimal phase relationship for the sub-system clocking. In addition, cross-clock domain data and signal handover is simplified when the sub-system clocking has a known phase relationship.

Accordingly, there is a need in the art for a clock phase management in which the output clock signals from fractional-N PLLs have a known phase relationship.

SUMMARY

To provide a known phase relationship between the output clock signals from a plurality of fractional-N PLLs, each fractional-N PLL is configured to begin a phase accumulation responsive to a corresponding edge of a reference clock signal so as to begin driving an output clock signal. For example, a first fractional-N PLL may begin responsive to a first edge of the reference clock signal. Similarly, a second fractional-N PLL may begin responsive to a second edge of the reference clock signal, and so. In this fashion, each fractional-N PLL has a known starting time that is synchronous with the reference clock signal. During operation, each fractional-N PLL adjusts its output clock signal to be phase-aligned with the reference clock signal. The resulting output clock signals thus advantageously possess a known phase relationship to each other. In addition, each fractional-N PLL may be configured to offset the phase accumulation by a known starting phase or offset.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A clock distribution architecture is provided in which the output clock signals from a plurality of fractional-N PLLs have a known phase relationship. To provide this phase relationship for the output clock signals, each fractional-N PLL receives a trigger signal with the reference clock signal. The trigger signal identifies a specific clock edge in the reference clock signal (either a rising or a falling edge). Each fractional-N PLL begins operation responsive to the identified reference clock signal edge as identified by the fractional-N PLL's trigger signal. Because the start times for the fractional-N PLLs are synchronous with specific edges of the reference clock signal, their output clock signals will have a known phase relationship once the fractional-N PLLs achieve lock. To provide additional flexibility with regard to tuning the phase relationship for the output clock signals, the accumulator within each fractional-N PLL may be loaded or offset by a pre-programmed phase. The resulting known phase relationship between the output clock signals from the various fractional-N PLLs is quite advantageous in assorted applications that benefit from the known phase relationship such as MIMO operation and cross-clock domain data or signal handover.

Figure 2:
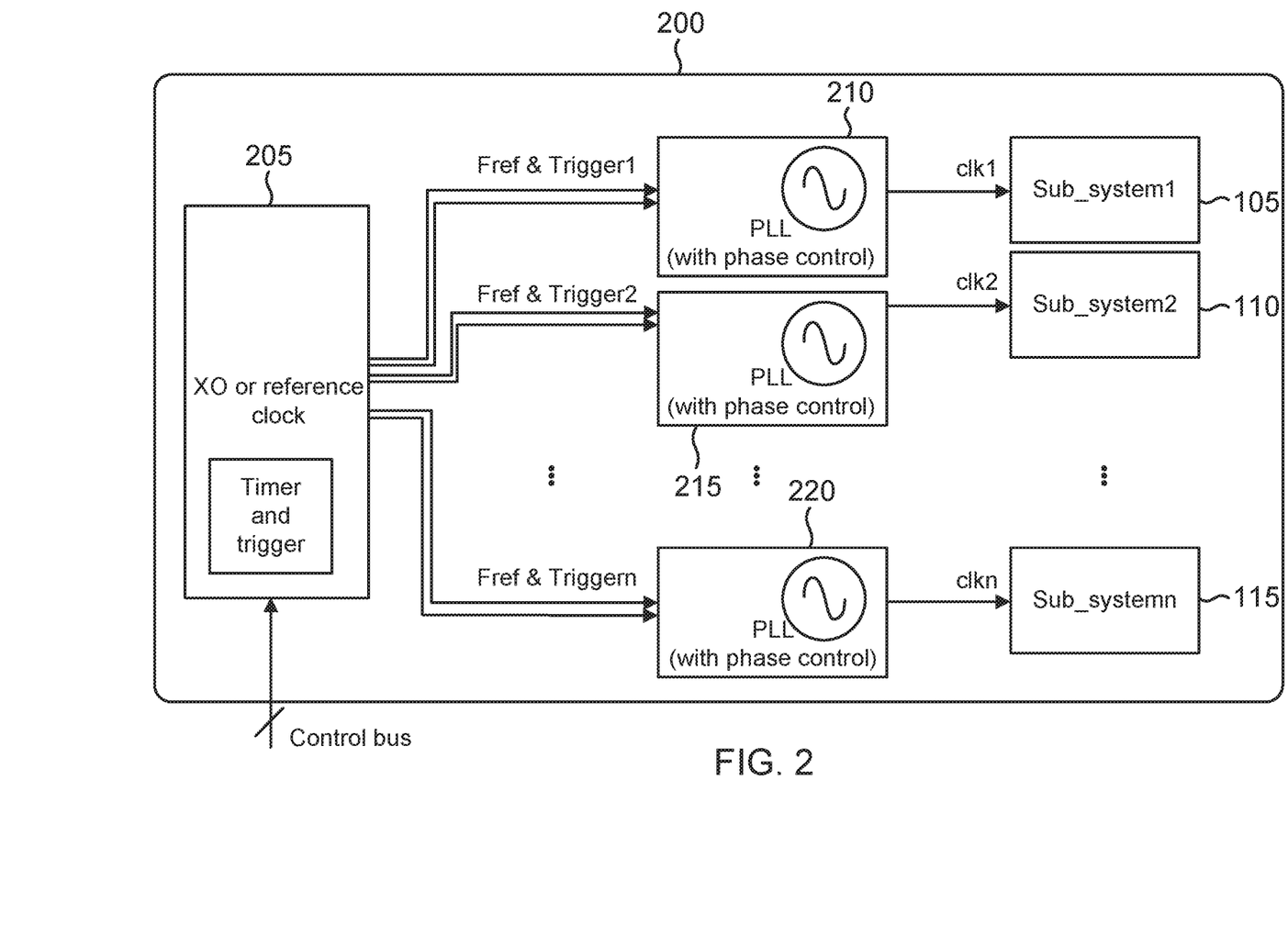
FIG. 2 illustrates a clock distribution architecture for an SoC in which the clocking of sub-systems by fractional-N PLLs has a known phase relationship in accordance with an aspect of the disclosure.

An example clock distribution architecture for an SoC 200 is shown in FIG. 2. SoC 200 includes the plurality of n sub-systems ranging from first sub-system 105 to the nth sub-system 115 discussed with regard to SoC 100 of FIG. 1. However, the clocking of the sub-systems is altered in that the corresponding plurality of clock signals all have a known phase relationship to each other despite their production by fractional-N PLLs. In particular, a first fractional-N PLL 210 clocks first sub-system 105 with a clock signal clk1. Similarly, a second fractional-N PLL 215 clocks second sub-system 110 with a clock signal clk2, and so on such that an nth fractional-N PLL 220 clocks nth sub-system 15 with a clock signal clkn. The plurality of n clock signals (ranging from clock signal clk1 to clock signal clkn) have a known phase relationship to each other.

To provide this known phase relationship, a reference clock source 205 (for example, a crystal oscillator (XO)) distributes a reference clock Fref to each fractional-N PLL along with a corresponding trigger signal. For example, first fractional-N PLL 210 receives a first trigger signal Trigger1. Similarly, second fractional-N PLL 215 receives a second trigger signal Trigger2, and so on such that nth fractional-N PLLL 220 receives an nth trigger signal Triggern. As will be explained further herein, each trigger signal identifies a corresponding edge (either rising or falling) in the reference clock signal to the corresponding fractional-N PLL. Each fractional-N PLL is configured to respond to the corresponding trigger signal by beginning operation at the identified clock edge for the reference clock signal. Since each fractional-N PLL begins operation synchronously with a corresponding edge of the reference clock signal, the clock signals clk1 through clkn possess a predefined or known phase relationship once the enabled fractional-N PLLs achieve lock. To provide additional flexibility with regard to tuning or adjusting the desired phase relationship for the sub-system clocking, each fractional-N PLL may be configured to load a beginning or initial phase into its phase accumulation as will be explained further herein. However, it will be appreciated that such phase loading in the fractional-N PLLs may be omitted in alternative embodiments yet the clocking of the sub-systems will still have a predefined or known phase relationship.

Figure 3:
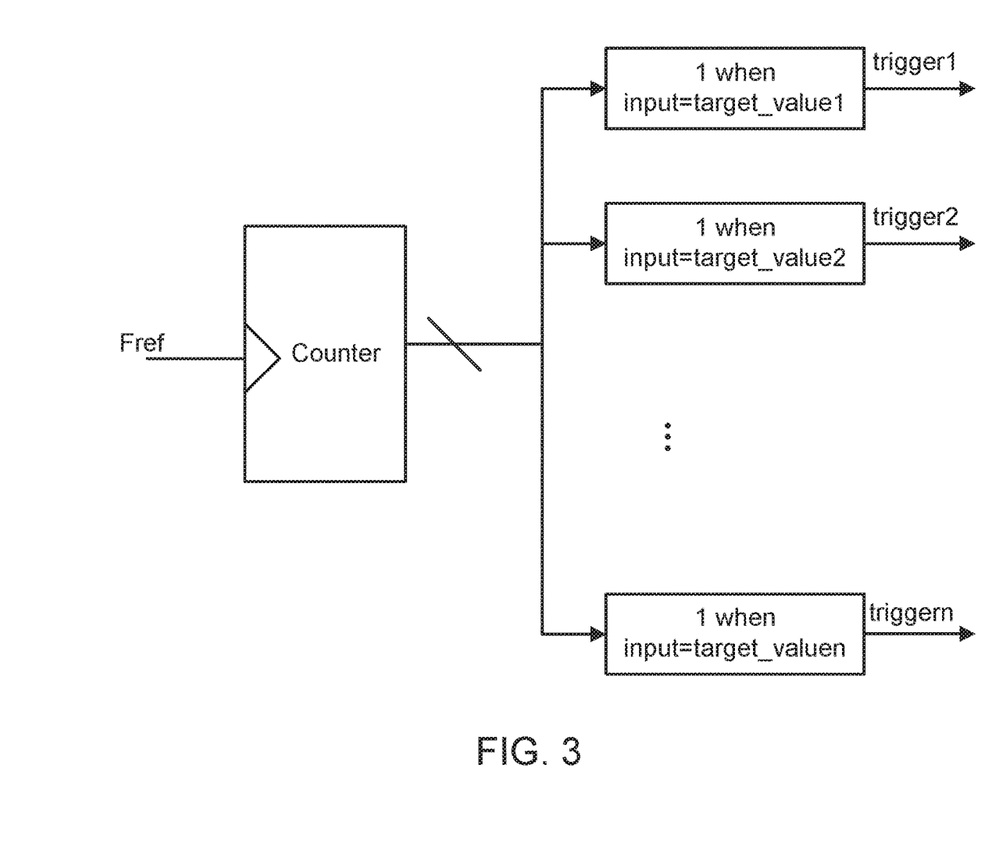
FIG. 3 illustrates a counter to generate the trigger signals in the SoC of FIG. 2 in accordance with an aspect of the disclosure.

To produce the trigger signals, reference clock source 205 may include a counter 300 as shown in FIG. 3. Each trigger signal has a corresponding count (target value). Counter 300 increments its count responsive to either rising or falling edges of the reference clock signal. Alternatively, counter 300 may increment its count responsive to both rising and falling edges of the reference clock signal. Each trigger signal is asserted when the count reaches a corresponding target value. For example, the first trigger signal is asserted when the count reaches a first target value (target_value1), the second trigger signal is asserted when the count equals a second target_value (target_value2), and so on such that the nth trigger signal is asserted when the count equals an nth target_value (target_valuen). Referring back to FIG. 2, the target values for the trigger signals may be loaded in to reference clock source 205 through a control bus.

Each fractional-N PLL is configured to detect the assertion of the corresponding trigger signal. In one embodiment, a pulse swallower circuit (not illustrated) in reference clock source 205 may swallow a pulse of the reference clock to function as the trigger signal for a corresponding fractional-N PLL such that no separate channel or wire would be necessary to conduct the trigger signals to the fractional-N PLLs. Alternatively, the trigger signals may be pulsed signals carried on separate channels or leads to each fractional-N PLL. In such embodiments, each fractional-N PLL may be configured to sample its pulsed trigger signal using a clock edge of the reference clock. Upon detecting the sampled pulsed trigger signal, the fractional-N PLL commences operation at the corresponding reference clock edge.

Figure 4:
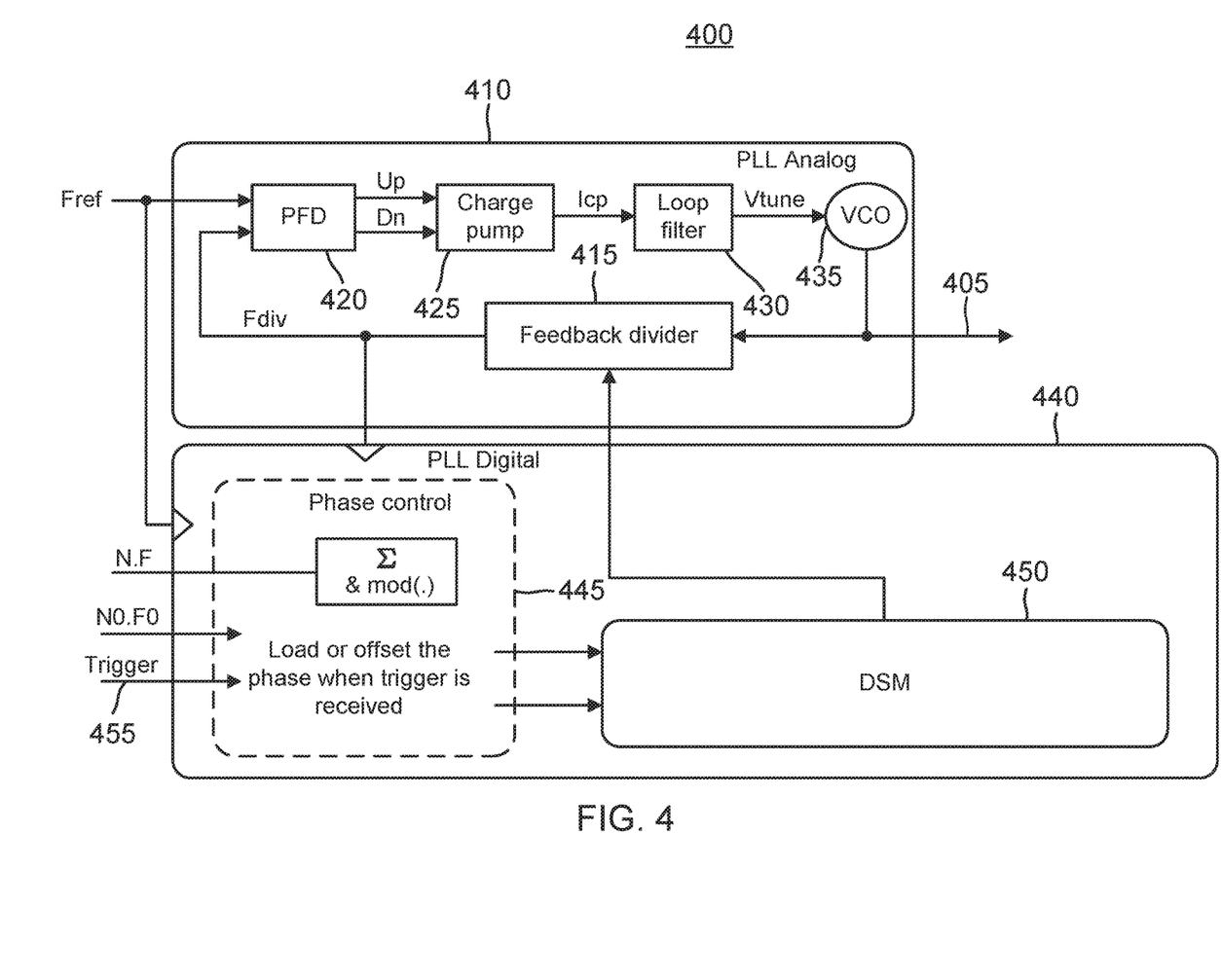
FIG. 4 is a diagram for a fractional-N PLL in the SoC of FIG. 2 in accordance with an aspect of the disclosure.

An example fractional-N PLL 400 is shown in more detail in FIG. 4. Fractional-N PLL 400 includes an analog portion 410 for generating a sub-system output clock signal 405 for clocking the corresponding sub-system (FIG. 2). Output clock signal 405 is divided in a feedback divider 415 to form a divided clock signal (Fdiv) that is compared with the reference clock signal (Fref) in a phase detector (PFD) 420. Depending upon whether the divided clock signal is leading or lagging the reference clock signal, phase detector 420 asserts either an up signal (Up) or a down signal (Dn). A charge pump 425 charges a charge pump output signal (Icp) if the up signal is asserted or discharges the charge pump output signal if the down signal is asserted. After filtering in a loop filter 430, the charge pump output signal becomes a tuning control voltage Vtune that controls the frequency of a voltage-controlled oscillator VCO 435. Should feedback divider 415 divide by a constant integer N, analog portion 410 forms a conventional integer PLL. However, fractional-N PLL 400 also includes a digital portion 440 that toggles or dithers the integer N used by fractional divider 415 to effect the desired integer plus some fraction relationship between the frequency of the reference clock signal and sub-system clocking signal frequency for output clock signal 405.

To perform the incrementing or dithering of the integer N used by feedback divider 415 to divide output clock signal 405, digital portion 440 includes a phase accumulator or phase control circuit 445. As known in the fractional-N PLL arts, the fractional portion of the relationship between the reference clock signal frequency and the output clock signal frequency may be represented by a ratio (K/M), where K and M are positive integers. This ratio may also be represented by a fraction F. M is the modulus for the counting in phase control circuit 445 whereas K in the increment successively added to the phase accumulator count. Phase control circuit 445 thus receives the factor N.F to identify the integer divider N and the fractional portion F. In one embodiment, the feedback divider 415 may be configured to divide by N+1 instead of N every time the modulo-N counting in phase control circuit 445 overflows. But such fractional-N PLL operation is then prone to developing undesirable spurs in the frequency spectrum for output clock signal 405. To reduce such spurs, digital portion 440 may also include a delta-sigma modulator (DSM) 450 that further dithers the incrementing of the divisor N for feedback divisor 415.

It will be appreciated, however, that fractional-N PLL 400 is just one embodiment. For example, analog portion 410 may instead be constructed for digital operation by replacing phase detector 420 with a time-to-digital converter. Similarly, DSM 450 may be omitted in alternative embodiments. But regardless of these modifications, phase control circuit 445 is configured to keep fractional-N PLL 400 in an idle or sleep mode of operation until its trigger signal 455 is asserted, whereupon fractional-N PLL 400 begins active operation to synchronize output clock 405 at the desired fractional relationship N.F with the reference clock signal frequency. Each fractional-N PLL 400 thus begins its phase accumulation at a corresponding clock edge for the reference clock signal. Since the phase accumulations across the various fractional-N PLLs in SoC 200 (FIG. 2) thus begin at specific clock edges for the reference clock signal, the output clock signals clocking the various sub-systems will all have a known phase relationship. In contrast, the enabling or triggering of the fractional-N PLLs in conventional SoC 100 has an unknown relationship with regard to the reference clock signal such that the phase relationship for the clocking of the sub-systems is unknown and uncontrolled. To further define or tune the phase relationship for the clocking of the sub-systems, each phase control circuit 445 may be configured to load or offset its phase accumulation by an initial phase represented by the variable N0.F0. For example, suppose that the modulus M is 16 and the increment K is 3. Without a phase offset, the phase accumulation would proceed as 0, 3, 6, 9, 12, 15 and then overflow. But with a phase offset of one, the phase accumulation would proceed as 1, 4, 7, 10, 13, and then overflow. In this fashion, the phase relationship for output clock signals 405 may be adjusted by a desired phase offset or load in particular ones of the fractional-N PLLs 400 (or in all of them). In some embodiments, analog portion 410 may be deemed to form a means for producing an output clock signal having a frequency that is a non-integer multiple of a frequency for the reference clock signal responsive to the phase accumulation in digital portion 440.

Figure 5:
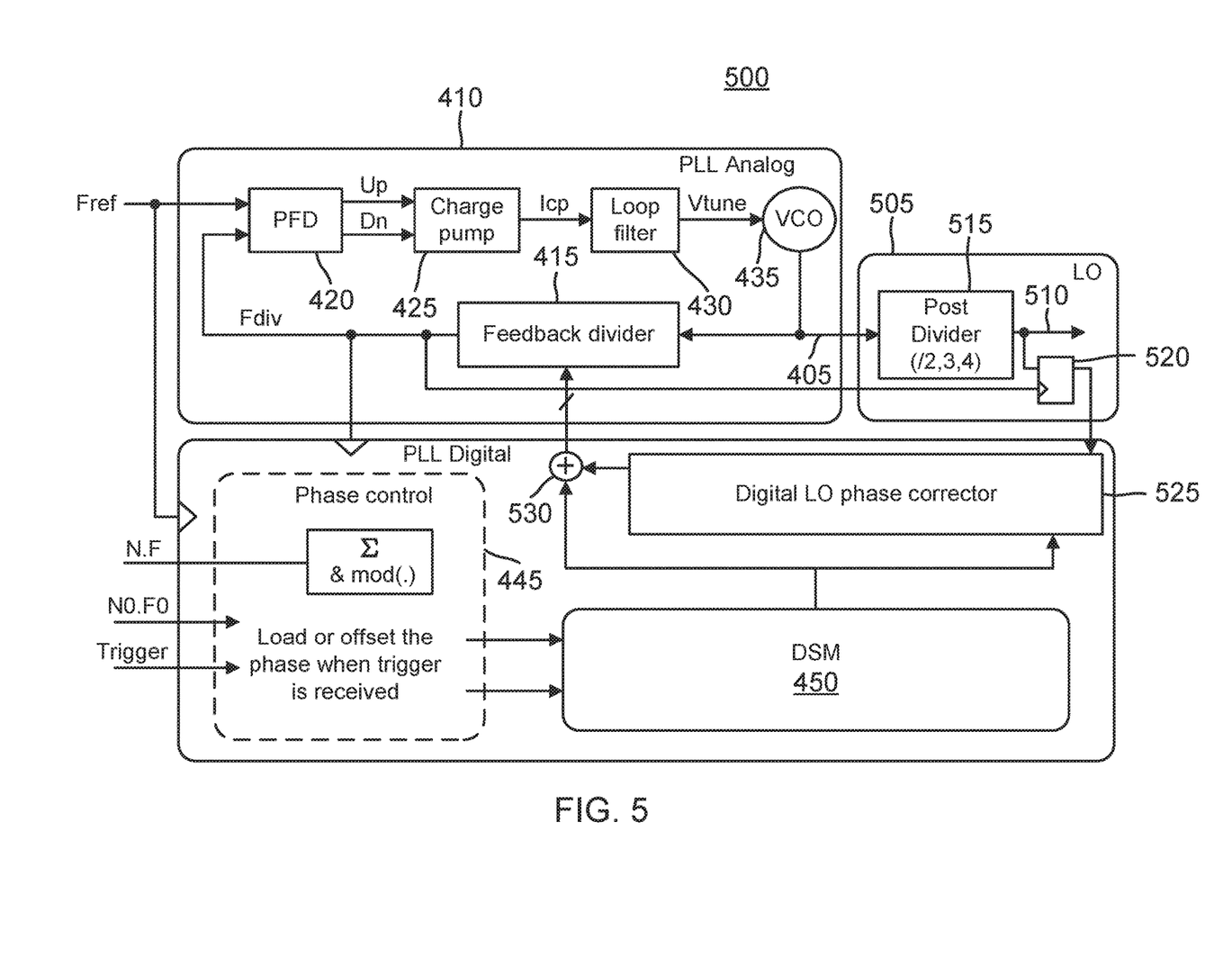
FIG. 5 illustrates a modification of the fractional-N PLL of FIG. 5 to include a post divider in accordance with an aspect of the disclosure.

The advantageous phase relationship for the output clocks from the fractional-N PLLs may be practiced in fractional-N PLLs that include a post divider for dividing down the output clock such as used, for example, to form the local oscillator (LO) signal for RF applications. An example fractional-N PLL 500 including a local oscillator portion 505 is shown in FIG. 5. Analog portion 410 functions as discussed with regard to fractional-N PLL 400 of FIG. 4. However, output clock signal 405 from analog portion 410 is divided in a post divider 515 to form a post-divided output clock signal 510. For example, post divider 515 may divide output clock by 2, or by 3, or by 4, and so on to form post-divided output clock signal 510. Referring back to SoC 200, such a post division in the clocking of the sub-systems may destroy the desired known phase relationship. For example, with regard to a post division by two, one sub-system clock signal may be out of phase with another sub-system clock signal by 0 degrees or by 180 degrees phase such that the phase relationship becomes uncertain. To maintain a known phase relationship, post-divided clock signal 510 is sampled by a register 520 as clocked by the divided clock signal from feedback divider 415. A digital portion 535 for fractional-N PLL 500 is modified as compared to digital portion 440 of FIG. 4 by the addition of a digital phase corrector circuit 525 and an adder 530. Digital phase corrector circuit 525 receives the data output from register 520 to sample the phase of post-divided clock signal 510. Depending upon the sampled phase, digital phase corrector circuit 525 adjusts the dithering of the feedback division by adding to the output of DSM 450 in an adder 530. Feedback divider 415 then adjusts its division responsive to a summed output signal from adder 530. In this fashion, the feedback division is adjusted to maintain the desired phase relationship for the clocking of the sub-systems. Referring back to FIG. 2, note that some of the fractional-N PLLs may employ post division whereas others may not. An example method of operation for a clock distribution architecture will now be discussed.

Figure 6:
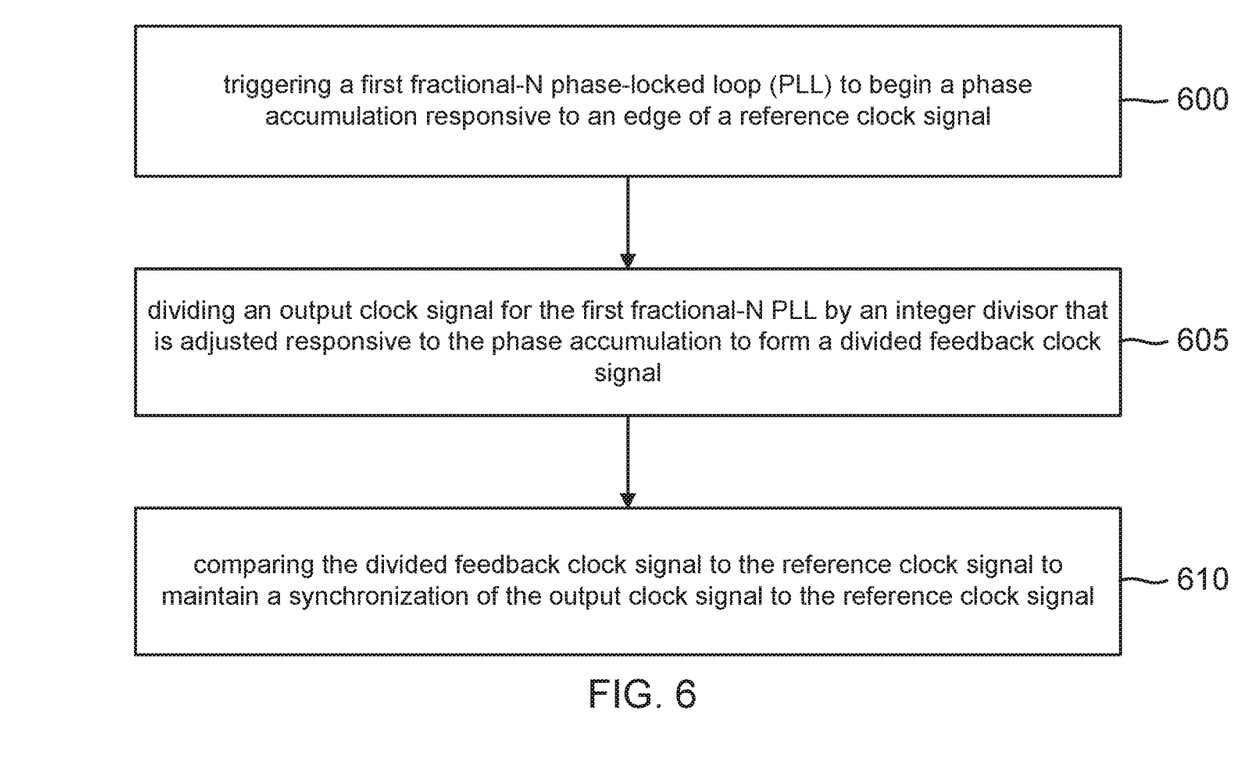
FIG. 6 is a flowchart for an example method of synchronizing a plurality of fractional-N PLLs so that their output clock signals have a known phase relationship in accordance with an aspect of the disclosure.

FIG. 6 is a flowchart for an example method of synchronizing the output clock signals from a plurality of fractional-N PLLs so that the output clock signals have a known phase relationship. The method begins with an act 600 of triggering a first fractional-N phase-locked loop (PLL) to begin a phase accumulation responsive to an edge of a reference clock signal. The triggering of fractional-N PLL 400 or 500 at a specific edge of the reference clock signal is an example of act 600. In addition, the method includes an act 605 of dividing an output clock signal for the first fractional-N PLL by an integer divisor that is adjusted responsive to the phase accumulation to form a divided feedback clock signal. The division in feedback divider 415 in fractional-N PLL 400 or 500 is an example of act 605. Finally, the method includes an act 610 of comparing the divided feedback clock signal to the reference clock signal to maintain a phase alignment of the output clock signal to the reference clock signal. An example of such phase alignment is performed by phase detector 420, charge pump 425, loop filter 430, and VCO 435. However, it will be appreciated that such phase alignment may be performed digitally as discussed above.

It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A fractional-N phase-locked loop (PLL), comprising:
a phase control circuit configured to begin a phase accumulation responsive to an identified edge of a reference clock signal, wherein the phase control circuit is configured to receive a trigger signal that identifies the identified edge of the reference clock signal;
a feedback divider configured to divide an output clock signal by an integer divisor that is adjusted responsive to the phase accumulation to form a divided feedback clock signal; and
an oscillator configured to drive the output clock signal at an output frequency responsive to a control signal so that the output clock signal is phase aligned with the reference clock signal.

2. The fractional-N PLL of claim 1, wherein the phase control circuit includes a delta-sigma modulator.

3. The fractional-N PLL of claim 1, wherein the phase control circuit is further configured to offset the phase accumulation by a phase offset.

4. The fractional-N PLL of claim 3, wherein the phase control circuit is further configured to receive the phase offset from an external source.

5. The fractional-N PLL of claim 1, wherein the edge of the reference clock signal is a rising edge.

6. The fractional-N PLL of claim 1, wherein the edge of the reference clock signal is a falling edge.

7. The fractional-N PLL of claim 1, further comprising:
a phase detector configured to compare the divided feedback clock signal to the reference clock signal to detect whether the divided feedback clock signal is leading or lagging the reference clock signal.

8. The fractional-N PLL of claim 7, further comprising:
a charge pump configured to charge or discharge a charge pump output signal responsive to the detection by the phase detector; and
a loop filter configured to filter the charge pump output signal to form a control voltage, wherein the oscillator is a voltage-controlled oscillator configured to be responsive to the control voltage.

9. The fractional-N PLL of claim 1, further comprising:
a post divider for dividing the clock output signal to form a post-divided output clock output signal; and
a digital phase corrector circuit configured to adjust the phase accumulation responsive to a phase of the post-divided output clock signal.

10. A method, comprising:
receiving a trigger signal to identify an edge of a reference clock signal;
beginning a phase accumulation responsive to the identified edge of the reference clock signal; and
dividing an output clock signal for the first fractional-N PLL by a divisor that is adjusted responsive to the phase accumulation to form a divided feedback clock signal; and
comparing the divided feedback clock signal to the reference clock signal to maintain a phase alignment of the output clock signal to the reference clock signal.

11. The method of claim 10, wherein receiving the trigger signal comprises detecting a swallowed pulse in the reference clock signal.

12. The method of claim 10, wherein receiving the trigger signal comprises receiving a pulsed signal that is sampled responsive to the edge of the reference clock signal.

13. The method of claim 10, further comprising:
post-dividing the clock output signal to form a post-divided output clock signal;
sampling a phase of the post-divided output clock signal; and
adjusting the phase accumulation responsive to the sampling of the phase of post-divided output clock signal.

14. The method of claim 10, further comprising:
beginning the phase accumulation with a phase offset.

15. A fractional-N phase-locked loop (PLL), comprising:
a phase control circuit configured to begin a phase accumulation responsive to an edge of a reference clock signal;
means for producing an output clock signal having a frequency that is a non-integer multiple of a frequency for the reference clock signal responsive to the phase accumulation;
a post divider for dividing the clock output signal to form a post-divided output clock output signal; and
a digital phase corrector circuit configured to adjust the phase accumulation responsive to a phase of the post-divided output clock signal.

16. The fractional-N PLL of claim 15, wherein the phase control circuit includes a delta-sigma modulator.

17. The fractional-N PLL of claim 15, wherein the fractional-N PLL is integrated into an integrated circuit.

* * * * *